US009621110B1

(12) United States Patent
Boyavalle et al.

(10) Patent No.: US 9,621,110 B1
(45) Date of Patent: Apr. 11, 2017

(54) CAPACITIVE CROSS-COUPLING AND HARMONIC REJECTION

(71) Applicant: ACCO, Louveciennes (FR)

(72) Inventors: Christophe Boyavalle, Triel sur Seine (FR); Denis A. Masliah, St.-Germain en Laye (FR); Francis C. Huin, Soullans (FR)

(73) Assignee: ACCO, Louveciennes (FR)

( * ) Notice: Subject to any disclaimer, the term of this patent is extended or adjusted under 35 U.S.C. 154(b) by 0 days.

(21) Appl. No.: 14/930,185

(22) Filed: Nov. 2, 2015

(30) Foreign Application Priority Data

Oct. 30, 2015 (EP) .................................... 15306734

(51) Int. Cl.

*H03F 3/16* (2006.01)
*H03F 1/22* (2006.01)
*H03F 1/02* (2006.01)
*H03F 3/193* (2006.01)
*H03F 3/21* (2006.01)

(52) U.S. Cl.

CPC ......... *H03F 1/0205* (2013.01); *H03F 3/1935* (2013.01); *H03F 3/211* (2013.01); *H03F 2200/451* (2013.01); *H03F 2203/21106* (2013.01)

(58) Field of Classification Search

CPC ... H03F 1/22; H03F 1/223; H03F 3/16; H03F 3/45
USPC ................................ 330/253, 277, 300, 311
See application file for complete search history.

(56) References Cited

U.S. PATENT DOCUMENTS

| | | | |
|---|---|---|---|
| 7,795,968 B1 | 9/2010 | Li et al. | |
| 2005/0110575 A1 | 5/2005 | Sivonen et al. | |
| 2009/0102571 A1 | 4/2009 | Park et al. | |
| 2009/0104873 A1 | 4/2009 | Chang et al. | |
| 2011/0050345 A1 | 3/2011 | Quack et al. | |
| 2012/0268205 A1 | 10/2012 | Presti | |
| 2013/0057332 A1* | 3/2013 | Aggeler ............... | H03K 17/102 327/430 |

(Continued)

FOREIGN PATENT DOCUMENTS

| | | |
|---|---|---|
| EP | 1085653 A1 | 3/2001 |
| EP | 1833162 A1 | 9/2007 |

OTHER PUBLICATIONS

U.S. Appl. No. 14/751,495, Hervé Cam, Multimode Operation for Differential Power Amplifiers, Jun. 26, 2015.

(Continued)

*Primary Examiner* — Steven J Mottola
(74) *Attorney, Agent, or Firm* — Royse Law Firm, PC

(57) ABSTRACT

A power amplifier of the present invention comprises a first cascode including a MOSFET and a JFET and a first capacitor electrically connected between the source and the drain of the JFET. Two such power amplifiers in parallel form a differential power amplifier. In the differential amplifier a second capacitor can be electrically connected between the source and the drain of the second JFET. Another differential power amplifier comprises a first capacitor electrically connected between the gate of the first MOSFET and the source of the second MOSFET, and a second capacitor electrically connected between the gate of the second MOSFET and the source of the first MOSFET. Some of these differential power amplifiers also include capacitors electrically connected between the sources and the drains of the JFETs.

10 Claims, 4 Drawing Sheets

200

OUTn OUTp

210

INn INp

(56) References Cited

U.S. PATENT DOCUMENTS

2014/0292287 A1* 10/2014 Rutter ...................... G05F 1/70
323/205

OTHER PUBLICATIONS

U.S. Appl. No. 14/493,695, Hervé Cam, Body Biasing for RF Switch Optimization, Sep. 23, 2014.

U.S. Appl. No. 14/979,337, Denis Masliah, Electronic Circuits Including a Mosfet and a Dual-Gate JFET, Dec. 22, 2015.

EP 15306734.3 Extended European Search Report, Apr. 29, 2016.

Trung-Kien Nguyen et al.: "CMOS low noise amplifier design optimization technique," IEEE International Midwest Symposium, IEEE, vol. 1, Jul. 25, 2004, pp. 1185-1188.

Liu Jinhua et al: "A 3-5GHz gm-boosted common-gate CMOS UWB LNA with a common-source auxiliary circuit," Microwave and millimeter wave technology, 2008, ICMMT 2008, International Conference on, IEEE, Piscataway, NJ, Apr. 21, 2008.

* cited by examiner

CAPACITIVE CROSS-COUPLING AND HARMONIC REJECTION

CROSS-REFERENCE TO RELATED APPLICATIONS

This application claims priority under 35 U.S.C. 119 to EPO Patent Application No. 15306734.3 filed on Oct. 30, 2015 and also entitled "Capacitive Cross-Coupling and Harmonic Rejection" which is incorporated herein by reference. This application is also related to U.S. patent application Ser. No. 14/531,754 filed on Nov. 3, 2014 and entitled "Electronic Circuits including a MOSFET and a Dual-Gate JFET" which is incorporated herein by reference.

BACKGROUND

Field of Invention

The present invention relates generally to RF circuits and more particularly to RF amplifiers.

Related Art

FIG. 1 illustrates a prior art RF power amplifier circuit 100. The circuit 100 comprises a MOSFET 110 and a JFET 120 arranged in a cascode configuration such that the drain of the MOSFET 110 is coupled to the source of the JFET 120. The source of the MOSFET 110 is coupled to ground, as is the gate of the JFET 120. An RF signal is received at the gate of the MOSFET 110 and an output is produced at the drain of the JFET 120. A single pair of a MOSFET 110 and a JFET 120 arranged in a cascode configuration forms a single-ended amplifier. Two such cascode pairs in parallel form a differential amplifier when supplied with a differential signal, as shown.

SUMMARY

An exemplary single-ended power amplifier circuit of the present invention comprises a first cascode including a first MOSFET and a first JFET. The first MOSFET has a source, a drain, and a gate, and the first JFET also includes a source, a drain, and a gate. In the cascode arrangement the drain of the first MOSFET is coupled to the source of the first JFET. This exemplary power amplifier further comprises a first capacitor electrically connected between the source of the first JFET and the drain of the first JFET. In various embodiments the gate of the first MOSFET is coupled to an input signal source and the gate of the first JFET is coupled to ground.

Two single-ended power amplifiers in parallel form a differential power amplifier additionally comprising a second cascode including a second MOSFET having a source, a drain, and a gate, and a second JFET having a source, a drain, and a gate, where the drain of the second MOSFET being coupled to the source of the second JFET. In the differential amplifier a second capacitor is electrically connected between the source of the second JFET and the drain of the second JFET. In some of these embodiments the gate of the first MOSFET and the gate of the second MOSFET are both coupled to an input signal source and the gate of the first JFET and the gate of the second JFET are both coupled to ground.

Another exemplary power amplifier circuit of the present invention is a differential power amplifier and comprises a first cascode including a first MOSFET and a first JFET and a second cascode including a second MOSFET and a second JFET. This exemplary power amplifier further comprises a first capacitor electrically connected between the gate of the first MOSFET and the source of the second MOSFET, and a second capacitor electrically connected between the gate of the second MOSFET and the source of the first MOSFET. Embodiments of this amplifier further comprise a first inductor electrically connected between ground and the source of the first MOSFET, and a second inductor electrically connected between ground and the source of the second MOSFET. In some of these embodiments, the gate of the first MOSFET and the gate of the second MOSFET can both be coupled to an input signal source and the gate of the first JFET and the gate of the second JFET can both be coupled to ground.

In further embodiments the differential power amplifier further comprises a third capacitor electrically connected between the source of the first JFET and the drain of the first JFET. Some of these embodiments further comprise a fourth capacitor electrically connected between the source of the second JFET and the drain of the second JFET.

DETAILED DESCRIPTION

The present invention describes RF amplifier circuits that provide greater linearity, and other benefits described herein. Both single-ended and differential amplifier embodiments can include a capacitor disposed in parallel to the JFET to reject and attenuate various harmonics that otherwise waste power. In other embodiments, a differential amplifier includes two capacitors cross-coupling the two halves of a differential amplifier circuit such as the differential amplifier with two halves shown in FIG. 1. In these embodiments one capacitor is cross-coupled between the gate of the MOSFET on each half and the source of the MOSFET on the other half.

Figure 1:
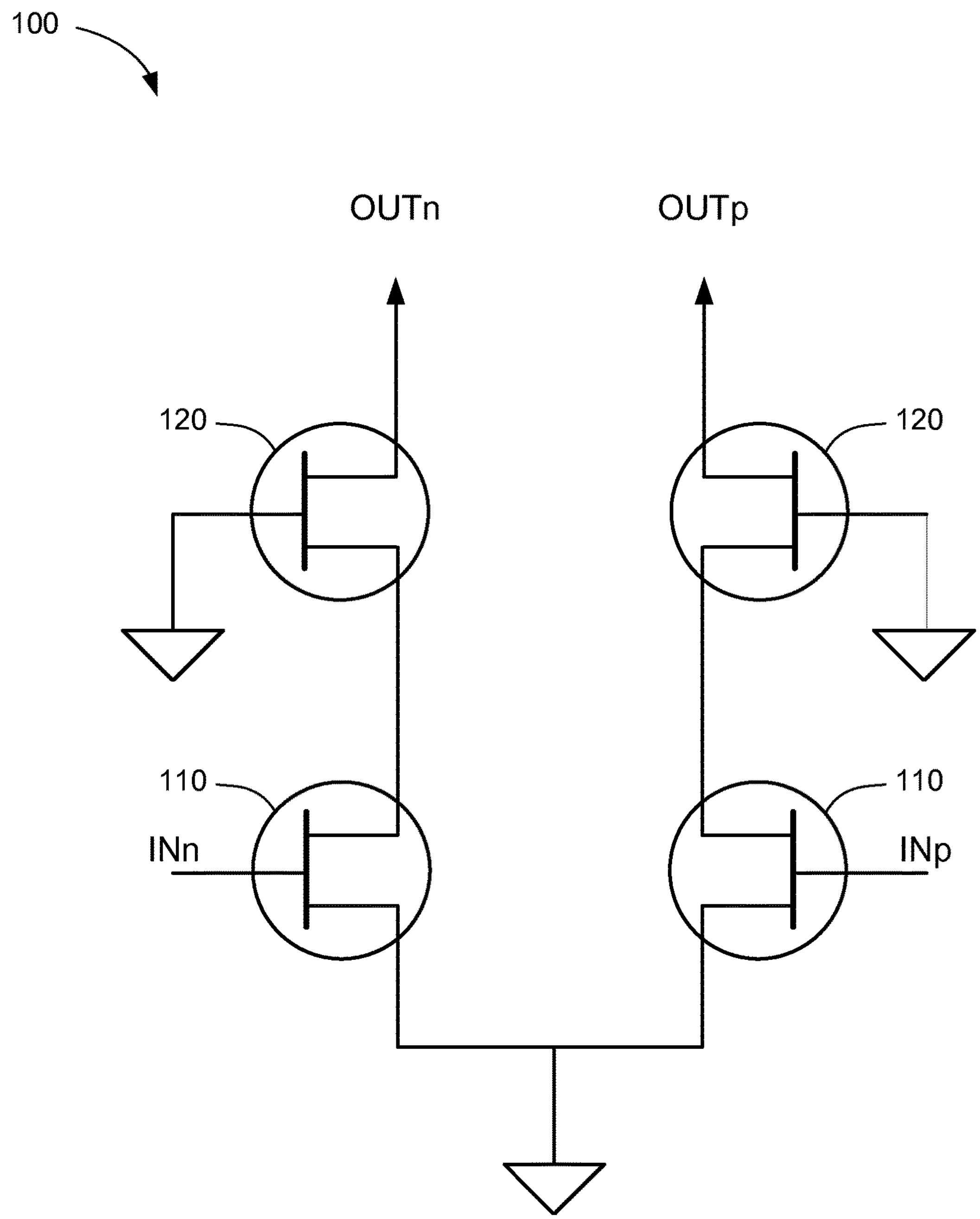
FIG. 1 is a schematic representation of an RF amplifier circuit according to the prior art.
Figure 2:
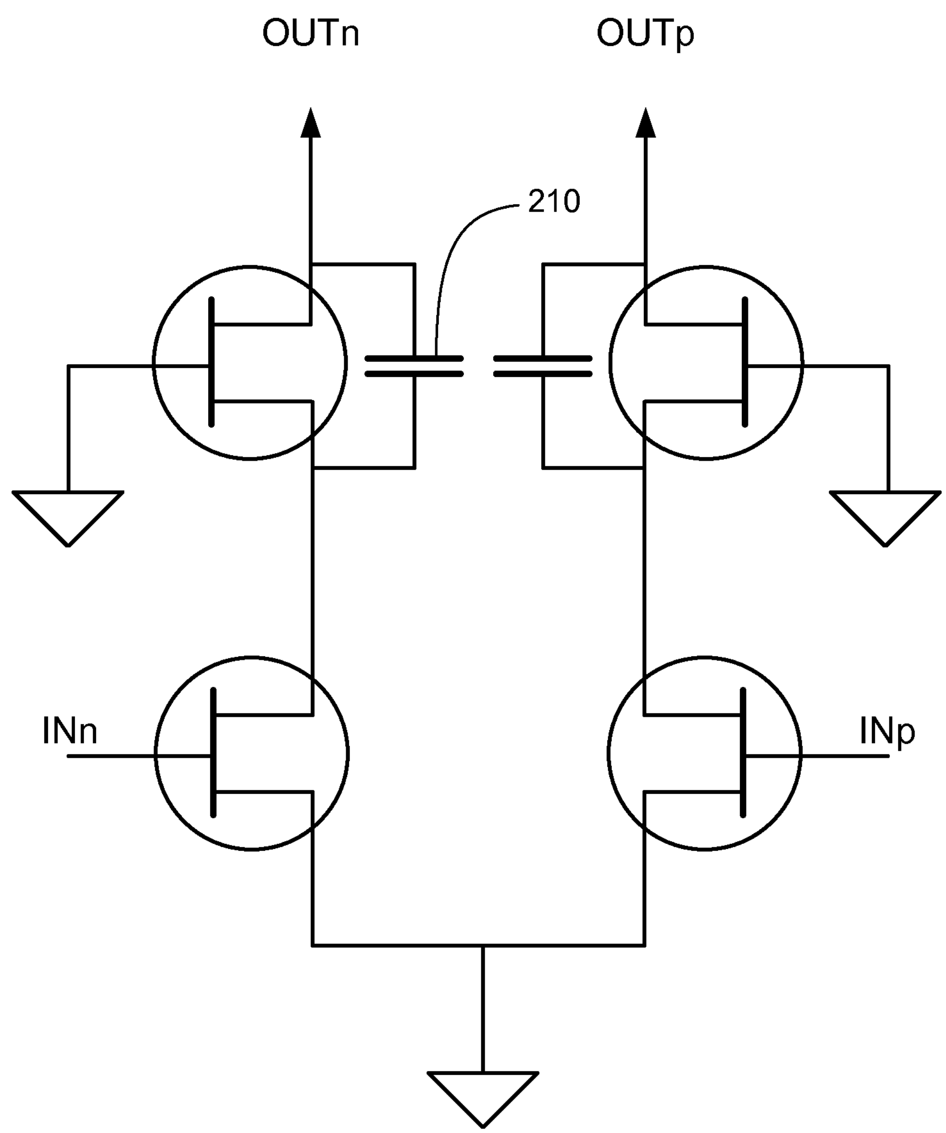
FIG. 2 is a schematic representation of an RF amplifier circuit according to an exemplary embodiment of the present invention.

FIG. 2 illustrates a differential RF power amplifier circuit 200 according to various embodiments of the present invention. The amplifier circuit 200 includes two circuits 100 each comprising a MOSFET 110 and a JFET 120 arranged in a cascode configuration, as in FIG. 1. Each circuit 100 further includes a capacitor 210 connected in parallel between the source and the drain of the JFET 120. While the illustration of FIG. 2 shows the amplifier circuit 200 with two parallel circuits 100, a single-ended differential amplifier can be realized from an individual circuit 100 with a capacitor 210 bridging the source and drain of the JFET 120 as illustrated. In some embodiments of the amplifier circuit 200, the capacitors 210 are matched to have the same capacitance.

The addition of the capacitor 210 to each circuit 100 reduces the amount of power that would otherwise end up in harmonics (in some cases up to the 5th order) at the output of the circuit 100 at constant output power, $P_{OUT}$. Since less power is lost to harmonics, the present invention results in a reduction in the consumed power at the output of the circuit 100 in the order of 8% at constant $P_{OUT}$. This reduction of consumed power results, in turn, in a reduction of the output power loss of the circuit 100 thereby improving its linear efficiency.

Figure 3:
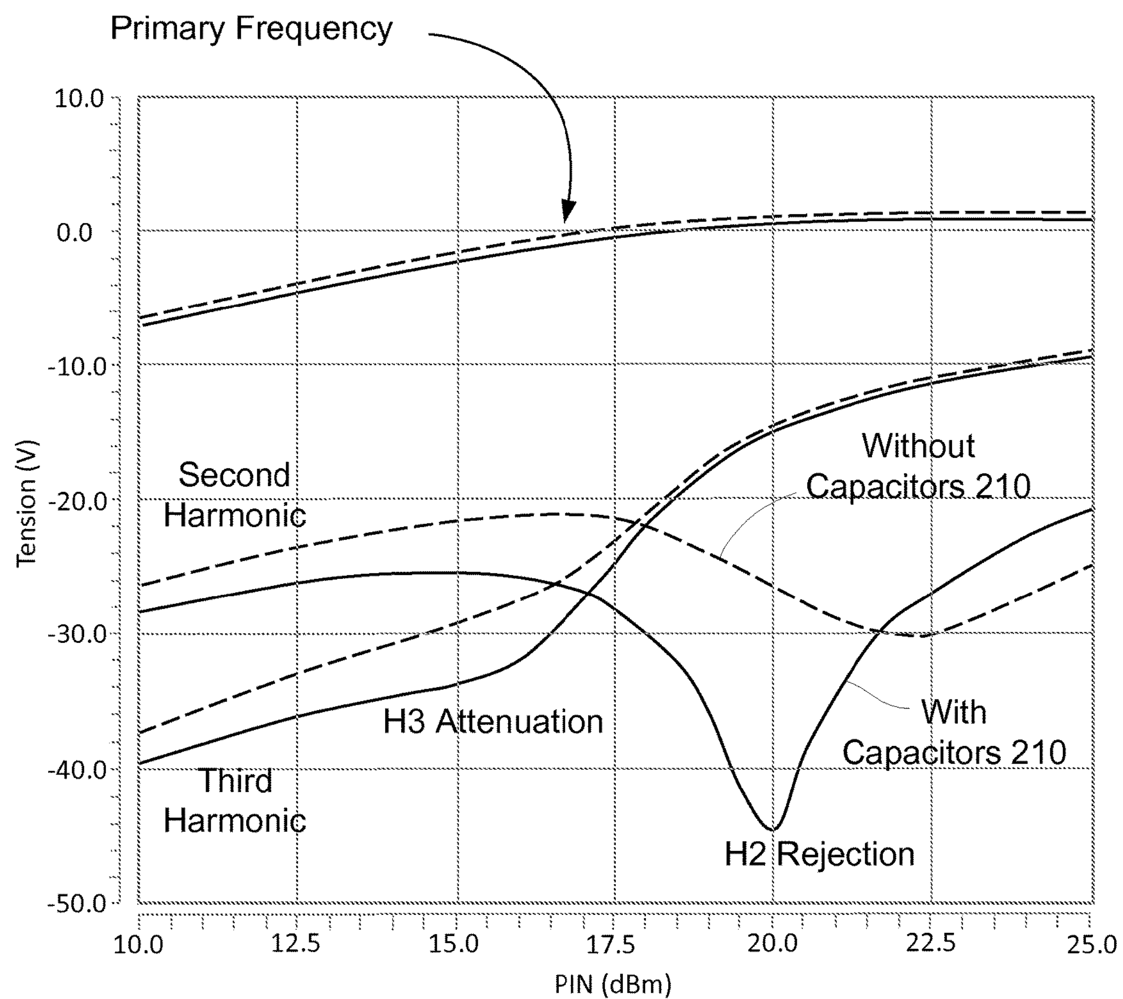
FIG. 3 is a graph showing the improvement of the embodiment of FIG. 2 as compared to the prior art.

More specifically, addition of the capacitor 210 serves to reject the second harmonic H2 and attenuate at least the third harmonic H3 across the JFET 120, as shown in FIG. 3. In particular, the capacitor 210 serves to create a resonance at twice the frequency of the input or primary frequency which rejects the second harmonic and serves to mitigate the third and higher harmonics, resulting in improved linearity and efficiency without degrading the primary signal. The graph in FIG. 3 shows the improvement of the amplifier circuit 200 of FIG. 2 as compared to that of prior art amplifier comprising the two circuits 100 of FIG. 1. In FIG. 3 the prior art amplifier is represented by dashed lines while the amplifier circuit 200 is represented with solid lines. While the primary frequency is relatively unaffected across the frequency range by the addition of the capacitors 210, the second harmonic is strongly rejected at a particular frequency which is tunable based on the capacitance of the capacitor 210.

Figure 4:
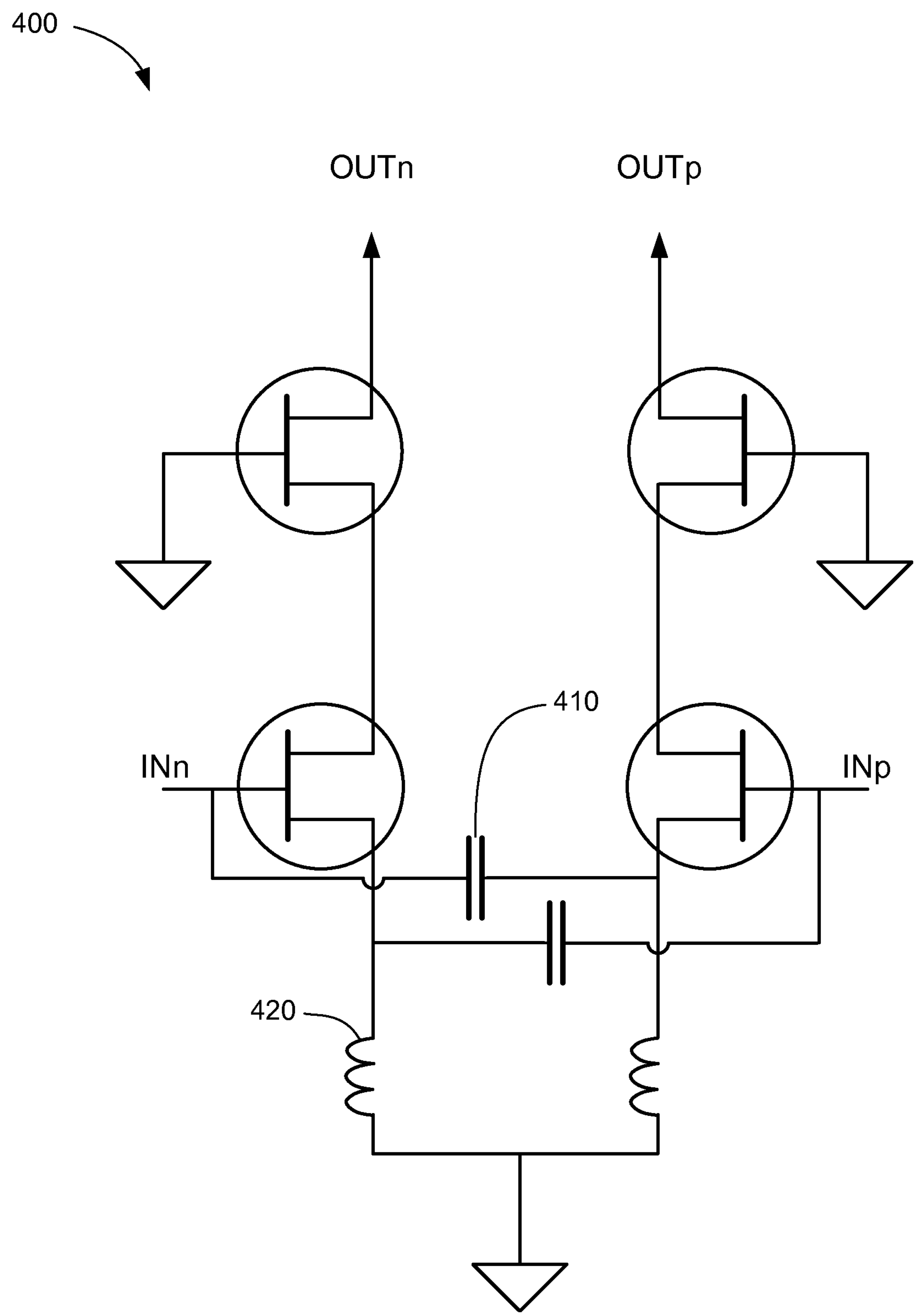
FIG. 4 is a schematic representation of an RF amplifier circuit according to another exemplary embodiment of the present invention.

FIG. 4 illustrates a differential RF power amplifier circuit 400 according to various embodiments of the present invention. The amplifier circuit 400 includes two circuits 100 each comprising a MOSFET 110 and a JFET 120 arranged in a cascode configuration, as shown in FIG. 1. In these embodiments, a first capacitor 410 is electrically connected between the gate of the MOSFET 110 on one side, and the source of the MOSFET 110 on the other side. A second capacitor 410 is electrically connected between the gate of the MOSFET 110 on the second side and the source of the MOSFET 110 on the first side. Further embodiments can include additional capacitors 210 disposed across one or both JFETs 120, as in FIG. 2. In some embodiments of the amplifier circuit 400, the capacitors 410 are matched to have the same capacitance.

The amplifier circuit 400 also comprises, for each circuit 100, an inductor 420 in series between ground and the source of the MOSFET 110. The capacitive cross-coupling at the source of the MOSFET 110 serves to act directly on the nonlinearity caused by the gate to source capacitance (Cgs) of the MOSFET 110. For this, the inductors 420 create a voltage difference between the ground and the cross-coupling capacitor. The capacitive cross-coupling generates a negative capacitance between the gate and the source of the MOSFET that compensates for the intrinsic capacitance of the gate to source capacitance of the MOSFET 110. The addition of a negative capacitance yields a final Cgs value that is lower than the intrinsic capacitance value of the MOSFET 110 which improves the linearity as described before. The capacitance value of cross-coupling is dependent on the size of the MOSFET 110 and the working frequency. Lowering the Cgs provides a significant improvement to the Power Added Efficiency PAE.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art. The term "connect" is differentiated herein from the term "couple" such that when two components are "connected" there are no other components disposed between them, whereas when two components are "coupled" there may be other components disposed between them.

What is claimed is:

1. A power amplifier comprising:
a first cascode including
a first MOSFET having a source, a drain, and a gate, and
a first JFET having a source, a drain, and a gate,
the drain of the first MOSFET being coupled to the source of the first JFET;
a first capacitor electrically connected between the source of the first JFET and the drain of the first JFET;
a second cascode including
a second MOSFET having a source, a drain, and a gate, and
a second JFET having a source, a drain, and a gate,
the drain of the second MOSFET being coupled to the source of the second JFET; and
a second capacitor electrically connected between the source of the second JFET and the drain of the second JFET.

2. The power amplifier of claim 1 wherein the gate of the first MOSFET is coupled to an input signal source and the gate of the first JFET is coupled to ground.

3. The power amplifier of claim 1 wherein the gate of the first MOSFET and the gate of the second MOSFET are both coupled to an input signal source and the gate of the first JFET and the gate of the second JFET are both coupled to ground.

4. The power amplifier of claim 1 wherein the first and second capacitors are matched.

5. The power amplifier of claim 1 further comprising
a third capacitor electrically connected between the gate of the first MOSFET and the source of the second MOSFET;
a fourth capacitor electrically connected between the gate of the second MOSFET and the source of the first MOSFET;
a first inductor electrically connected between ground and the source of the first MOSFET; and
a second inductor electrically connected between ground and the source of the second MOSFET.

6. The power amplifier of claim 5 wherein the first and second capacitors are matched.

7. The power amplifier of claim 6 wherein the third and fourth capacitors are matched.

8. A differential power amplifier comprising:
a first cascode including
a first MOSFET having a source, a drain, and a gate, and
a first JFET having a source, a drain, and a gate,
the drain of the first MOSFET being coupled to the source of the first JFET;
a second cascode including
a second MOSFET having a source, a drain, and a gate, and
a second JFET having a source, a drain, and a gate,
the drain of the second MOSFET being coupled to the source of the second JFET;
a first capacitor electrically connected between the gate of the first MOSFET and the source of the second MOSFET;
a second capacitor electrically connected between the gate of the second MOSFET and the source of the first MOSFET;

a first inductor electrically connected between ground and the source of the first MOSFET; and a second inductor electrically connected between ground and the source of the second MOSFET.

9. The differential power amplifier of claim 8 wherein the gate of the first MOSFET and the gate of the second MOSFET are both coupled to an input signal source and the gate of the first JFET and the gate of the second JFET are both coupled to ground.

10. The differential power amplifier of claim 8 wherein the first and second capacitors are matched.

* * * * *